(12) United States Patent
Weissman et al.

(10) Patent No.: US 10,084,463 B2
(45) Date of Patent: Sep. 25, 2018

(54) RECONFIGURABLE TRANSCEIVERS

(71) Applicant: QUALCOMM Incorporated, San Diego, CA (US)

(72) Inventors: Haim Mendel Weissman, Haifa (IL); Mahim Ranjan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/413,993

(22) Filed: Jan. 24, 2017

(65) Prior Publication Data

US 2018/0019759 A1    Jan. 18, 2018

Related U.S. Application Data (60) Provisional application No. 62/361,355, filed on Jul. 12, 2016.

(51) Int. Cl.
| | |
|---|---|
| *H04B 1/38* | (2015.01) |
| *H03M 1/02* | (2006.01) |
| *H03F 3/19* | (2006.01) |
| *H03F 3/24* | (2006.01) |
| *H04L 5/00* | (2006.01) |
| *H03M 1/46* | (2006.01) |

(52) U.S. Cl.
CPC ............... *H03M 1/02* (2013.01); *H03F 3/19* (2013.01); *H03F 3/245* (2013.01); *H04B 1/38* (2013.01); *H04L 5/00* (2013.01); *H03F 2200/294* (2013.01); *H03F 2200/451* (2013.01); *H03M 1/46* (2013.01)

(58) Field of Classification Search
CPC .. H04B 1/40; H04B 3/23; H04B 13/02; H04L 27/2601; H04L 1/0001

USPC ................. 375/219, 221; 341/144, 155, 161
See application file for complete search history.

(56) References Cited

U.S. PATENT DOCUMENTS

| | | | |
|---|---|---|---|
| 5,584,059 A * | 12/1996 | Turney | H03C 1/06 |
| | | | 375/296 |
| 7,741,981 B1 | 6/2010 | Wan et al. | |
| 8,942,760 B2 | 1/2015 | De | |
| 9,231,524 B2 | 1/2016 | Cowley et al. | |
| 9,537,499 B2 * | 1/2017 | Harpe | H03M 1/1033 |
| 9,705,518 B2 * | 7/2017 | Chen | H03M 1/002 |
| 2008/0003962 A1 | 1/2008 | Ngai | |
| 2011/0249710 A1 | 10/2011 | Chou | |

(Continued)

FOREIGN PATENT DOCUMENTS

WO    2014020297 A1    2/2014

OTHER PUBLICATIONS

International Search Report and Written Opinion—PCT/US2017/035819—ISA/EPO—dated Aug. 24, 2017.

(Continued)

*Primary Examiner* — Khai Tran
(74) *Attorney, Agent, or Firm* — Procopio, Cory, Hargreaves & Savitch LLP/Qualcomm (57) ABSTRACT

A transceiver including: a reconfigurable circuit including a plurality of units including at least a converter, the converter including: a digital-to-analog converter (DAC); successive approximation register (SAR) logic configured to selectively couple to the DAC; and a plurality of switches configured to reconfigure the plurality of units of the reconfigurable circuit to operate the transceiver in a receive mode or transmit mode.

21 Claims, 11 Drawing Sheets

(56) References Cited

U.S. PATENT DOCUMENTS

2015/0145708 A1 5/2015 Wu et al.
2015/0244401 A1 8/2015 Chung et al.

OTHER PUBLICATIONS

Min S., et al., "A 2mW CMOS MICS-Band BFSK Transceiver with Reconfigurable Antenna Interface", Radio Frequency Integrated Circuits Symposium (RFIC), May 23, 2010, XP031684124, ISBN: 978-1-4244-6240-7, pp. 289-292.

* cited by examiner

RECONFIGURABLE TRANSCEIVERS

CROSS-REFERENCE TO RELATED APPLICATIONS

This application claims the benefit of priority under 35 U.S.C. § 119(e) of U.S. Provisional Patent Application No. 62/361,355, filed Jul. 12, 2016, entitled "Reconfigurable Transceivers."

BACKGROUND

Field

This disclosure relates generally to reconfigurable transceivers, and more specifically, to a transceiver configured to reuse the transmit/receive signal branch.

Background

Demands for low-power single-chip transceivers have been increasing for multi-standard wireless communications. However, developing a single-chip wireless transceiver capable of operating in many wireless standards while drawing small power is a challenging problem. Accordingly, a transceiver architecture that delivers low-power on a single chip may be directed to reducing the silicon area.

SUMMARY

The present disclosure describes a method to reduce the die area of TDD or half duplex transceiver.

In one embodiment, a transceiver is disclosed. The transceiver includes: a reconfigurable circuit including a plurality of units including at least a converter, the converter including: a digital-to-analog converter (DAC); successive approximation register (SAR) logic configured to selectively couple to the DAC; and a plurality of switches configured to reconfigure the plurality of units of the reconfigurable circuit to operate the transceiver in a receive mode or transmit mode.

In another embodiment, a method for reconfiguring a reconfigurable transceiver is disclosed. The method includes: configuring the reconfigurable transceiver with a plurality of units comprising at least a converter, the converter comprising a successive approximation register (SAR) and a digital-to-analog converter (DAC), in a receive mode by at least coupling the SAR counter to the DAC; and configuring the plurality of units to operate the reconfigurable transceiver in a transmit mode by at least decoupling the SAR counter from the DAC.

In another embodiment, a transceiver is disclosed. The transceiver includes: means for converting a signal; means for configuring the means for converting as means for analog-to-digital conversion of the signal during operation in a receive mode; and means for configuring the means for converting a signal as means for a digital-to-analog conversion of the signal during operation in a transmit mode.

In yet another embodiment, a transceiver is disclosed. The transceiver includes: a reconfigurable converter, the reconfigurable converter configured to: operate as a successive approximation register (SAR) analog-to-digital converter (ADC) in a receive mode; and operate as a digital-to-analog converter (DAC) in a transmit mode.

Other features and advantages of the present disclosure should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

As explained above, developing a single-chip wireless transceiver capable of operating in many wireless standards while drawing small power is a challenging problem. Accordingly, a transceiver architecture that delivers low-power on a single chip may be directed to reducing the silicon area.

In certain implementations of the present disclosure, the silicon area of a transceiver chip is reduced by configuring the transceiver to reuse the transmit/receive signal branch for a half-duplex mode of operation, which enables transmission of signals in both directions but not simultaneously. In other implementations, the silicon area of a transceiver chip is also reduced by configuring the successive approximation register (SAR) analog-to-digital converter (ADC) as an ADC or digital-to-analog converter (DAC). In further implementations, the silicon area of a transceiver chip is further reduced by configuring a radio frequency (RF) amplifier of a transceiver as a low noise amplifier (LNA) or power amplifier (PA) of different power levels.

After reading this description it will become apparent how to implement the disclosure in various implementations and applications. Although various implementations of the present disclosure will be described herein, it is understood that these implementations are presented by way of example only, and not limitation. As such, this detailed description of various implementations should not be construed to limit the scope or breadth of the present disclosure.

Figure 1:
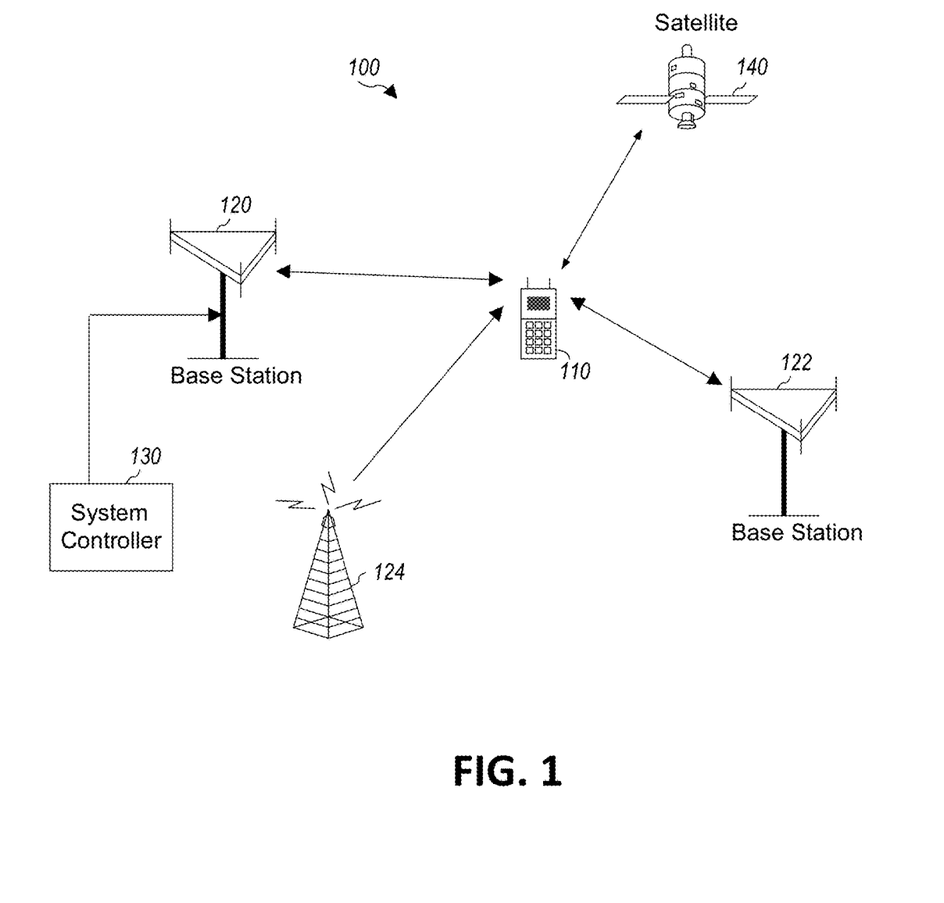
FIG. 1 is an exemplary wireless device communicating with a wireless communication system.

FIG. 1 is an exemplary wireless device 110 communicating with a wireless communication system 100. Wireless communication system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 100 including two base stations 120 and 122 and one system controller 130. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 100. Wireless device 110 may also receive signals from broadcast stations (e.g., broadcast station 124), signals from satellites (e.g., satellite 140) in one or more global navigation satellite systems (GNSS), etc. Wireless device 110 may support one or more radio technologies for wireless communication including LTE, WCDMA, CDMA 1X, EVDO, TD-SCDMA, GSM, 802.11, etc.

Figure 2:
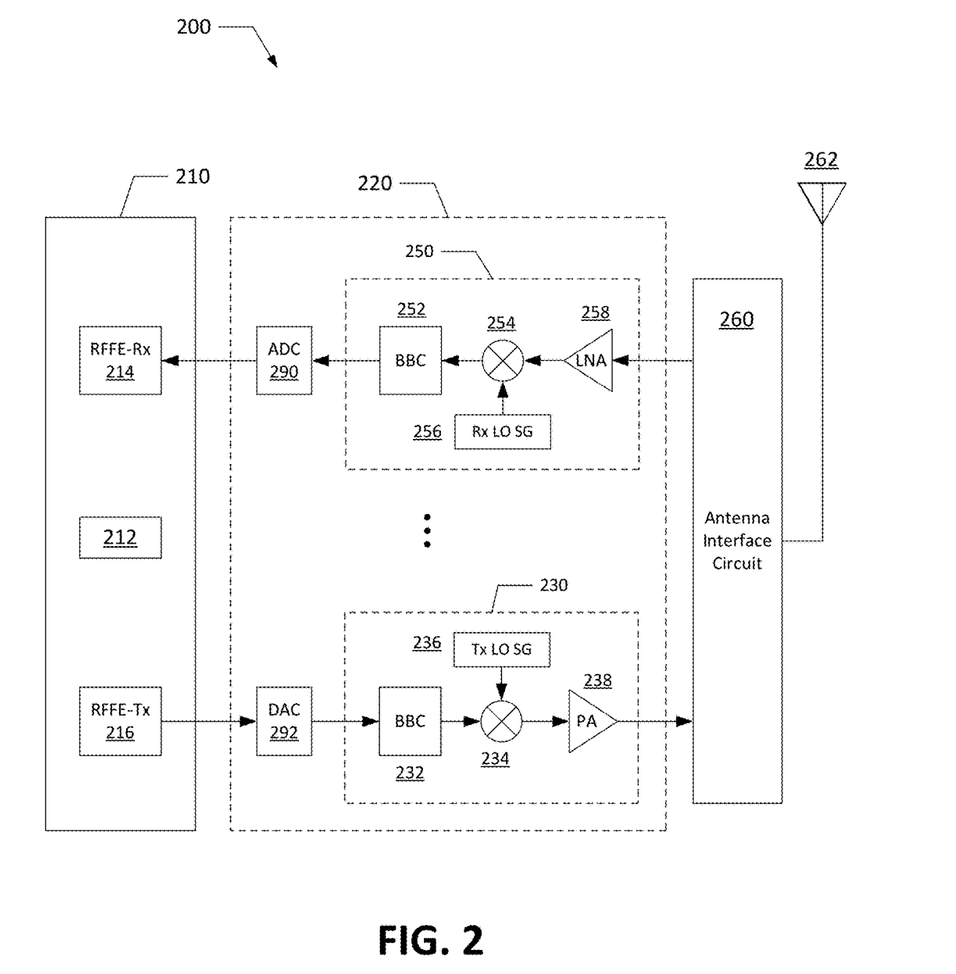
FIG. 2 is a functional block diagram of a wireless device that is one implementation of the wireless device of FIG. 1.

FIG. 2 is a functional block diagram of a wireless device 200 that is one embodiment of the wireless device 110 of FIG. 1. In this embodiment, the wireless device 200 includes a transceiver 220 coupled to an antenna 262 through an antenna interface circuit 260, and a data processor/controller 210. The transceiver 220 includes, among other blocks, a receiver 250 and a transmitter 230 to support bi-directional communication. The antenna interface circuit 260 couples the antenna 262 to either the transmitter 230 or receiver 250. In the illustrated embodiment of FIG. 2, the transceiver 220 is illustrated as having two branches, a transmitter branch 292, 230 and a receiver branch 250, 290, to show the functions of the units in each branch.

In FIG. 2, the transceiver 220 also includes an analog-to-digital converter (ADC) 290 and a digital-to-analog converter (DAC) 292. The ADC 290 converts the analog input signal received from the receiver 250 to the digital data. The DAC 292 converts the digital data generated in the data processor/controller 210 to an analog output signal and provides the converted analog output signal to the transmitter 230. In general, the wireless device 200 may include any number of transmitters and receivers for any number of communication systems and frequency bands.

The data processor/controller 210 includes a memory unit 212 to store data and program codes. The data processor/controller 210 may perform various functions for the wireless device 200. For example, the data processor/controller 210 may perform processing for data being received via the receiver 250 and data being transmitted via the transmitter 230. The data processor/controller 210 may also control the operation of various circuits within the transceiver 220. The data processor/controller 210 may be implemented on one or more application specific integrated circuits (ASICs) and/or other integrated circuits (ICs).

The data processor/controller 210 also includes a digital baseband receiver radio frequency (RF) front-end processor (RFFE-Rx) 214 and a digital baseband transmitter RF front-end processor (RFFE-Tx) 216. The RFFE-Rx 214 processes the digital baseband signal received from the ADC 290, while the RFFE-Tx 216 processes the digital baseband signal transmitted to the DAC 292.

In FIG. 2, the receiver 250 includes a low noise amplifier (LNA) 258, a mixer/downconverter 254, a receiver local oscillator signal generator (Rx LO SG) 256, and a first baseband circuitry 252, which may include baseband amplifiers and/or filters. The Rx LO SG 256 in the receiver 250 receives a clock signal from a crystal oscillator through a receiver phase locked loop (not shown). The Rx LO SG 256 may include a frequency divider that receives the clock signal and provides a divider output signal. The clock signal may be generated by a voltage-controlled oscillator (VCO) or some other types of oscillator. The clock signal may also be referred to as a VCO signal, an oscillator signal, etc.

For data reception, antenna 262 receives signals from base stations and/or other transmitter stations and provides a received RF signal, which is routed through an antenna interface circuit 260 and presented as an input RF signal to the receiver 250. The antenna interface circuit 260 may include switches, duplexers, transmit filters, receive filters, matching circuits, etc. Within the receiver 250, the LNA 258 amplifies the input RF signal and provides an output RF signal to the mixer/downconverter 254. The Rx LO SG 256 generates a local oscillator signal. The mixer/downconverter 254 mixes the output RF signal with the generated local oscillator signal to downconvert the output RF signal from RF to baseband. The first baseband circuitry 252 amplifies and/or filters the baseband signal to provide an analog input signal to the ADC 290, which converts the analog input signal to the digital baseband signal and sends the digital signal to RFFE-Rx 214 in the data processor/controller 210. The receiver 250 may include other elements such as matching circuits, an oscillator, etc. In one implementation, ADC 290 may be implemented with a successive approximation register (SAR) ADC.

In FIG. 2, the transmitter 230 includes a second baseband circuitry 232, a mixer/upconverter 234, a transmitter local oscillator signal generator (Tx LO SG) 236, and a power amplifier (PA) 238. The second baseband circuitry 232 may include baseband amplifiers and/or filters. The Tx LO SG 236 in the transmitter 230 receives a clock signal from a crystal oscillator through a transmitter phase locked loop (not shown). The Tx LO SG 236 may include a frequency divider that receives the clock signal and provides a divider output signal. The clock signal may be generated by a voltage-controlled oscillator (VCO) or some other types of oscillator. The clock signal may also be referred to as a VCO signal, an oscillator signal, etc.

For data transmission, the RFFE-Tx 216 in the data processor/controller 210 processes (e.g., encodes and modulates) data to be transmitted and provides a digital data to the DAC 292. The DAC 292 converts the digital data to a baseband analog output signal and provides the converted analog output signal to the transmitter 230, which generates a transmit RF signal. Within the transmitter, the second baseband circuitry 232 filters and/or amplifies the baseband analog signal received from the DAC 292 and sends the filtered signal to the mixer/upconverter 234. The Tx LO SG 236 generates a local oscillator signal. The mixer/upconverter 234 mixes the filtered baseband signal with the generated local oscillator signal to upconvert the baseband signal to the RF signal. The power amplifier (PA) 238 amplifies the RF signal sufficiently to drive the antenna 262. The amplified RF signal is routed through the antenna interface circuit 260 and transmitted via antenna 262. The transmitter 230 may include other elements such as matching circuits, an oscillator, etc.

Figure 3:
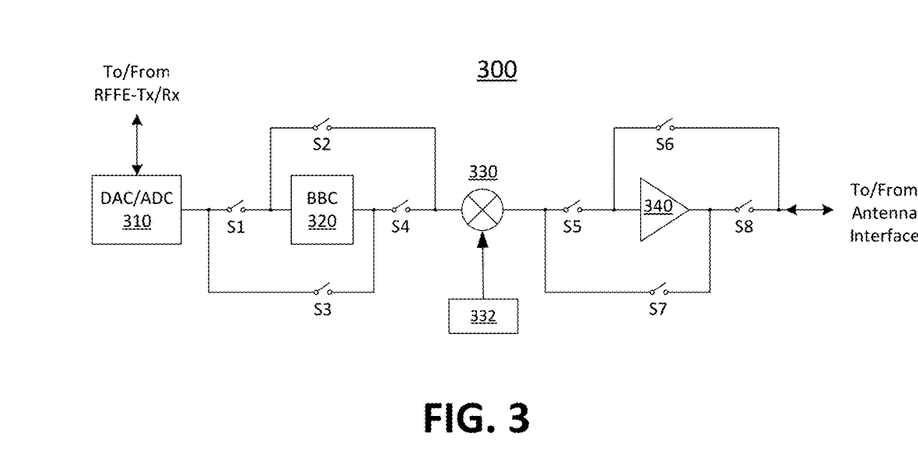
FIG. 3 is a functional block diagram of a transceiver 300 configured with a single transceiver branch in accordance with one embodiment of the present disclosure.

FIG. 3 is a functional block diagram of a transceiver 300 (performing substantially similar functions as the transceiver 220 in FIG. 2) configured with a single transceiver branch in accordance with one embodiment of the present disclosure. Thus, the single branch of the transceiver 300 is configured/reconfigured to perform the substantially similar functions as the two branches of the transceiver 220 shown in FIG. 2. The single transceiver branch of the transceiver 300 is configured with a converter (i.e., either DAC or ADC) 310, a baseband circuitry 320, a mixer 330, a local oscillator (LO) 332, an RF amplifier (i.e., either LNA or PA) 340, and a plurality of switches S1 to S8.

In the illustrated embodiment of FIG. 3, the plurality of switches S1 through S8 is used to enable two signal paths (i.e., a receive path and a transmit path) for the single branch of the transceiver 300. The plurality of switches S1 to S8 is configured to reuse the converter 310, the baseband circuitry 320, the mixer 330, the LO 332, and the RF amplifier 340 in a half-duplex operation. Thus, by appropriately configuring the switches S1 to S8, the single transceiver branch can be configured into a transmit mode (using the transmit path) or receive mode (using the receive path).

The converter 310 receives a digital baseband signal from the RFFE-Tx module when the transmit path is used, while the converter 310 sends an analog baseband signal to the RFFE-Rx module when the receive path is used. See FIG. 5 for a detailed description. The RF amplifier 340 receives or sends the RF signal from or to the antenna interface circuit through switches S6 or S8. See FIG. 7 for a detailed description.

Figure 4A:
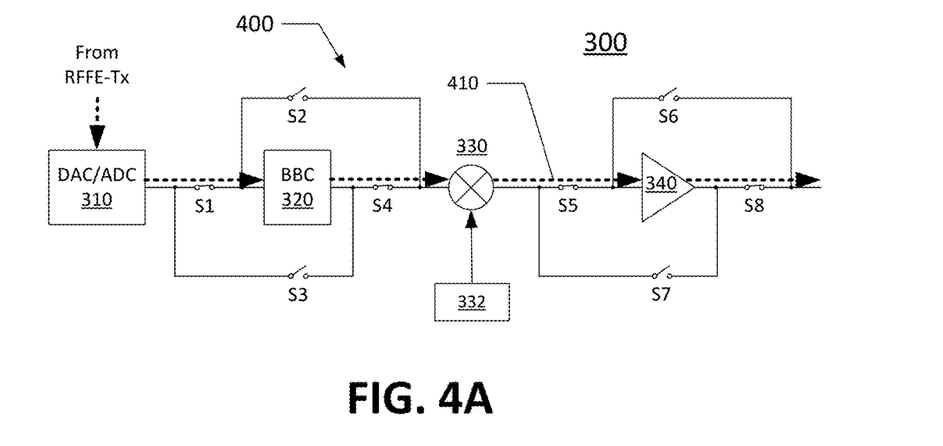
FIG. 4A shows a configuration in which switches S1, S4, S5, and S8 are closed while switches S2, S3, S6, and S7 are open to configure the transceiver into a transmit mode.

FIG. 4A shows a configuration 400 in which switches S1, S4, S5, and S8 are closed while switches S2, S3, S6, and S7 are open to configure the transceiver 300 into a transmit mode. Thus, in FIG. 4A, the switches in the transceiver 300 are configured to receive the digital baseband signal from the RFFE-Tx module and use the converter 310 as the DAC (e.g., element 292 in FIG. 2), the baseband circuitry 320 as the transmit baseband circuitry (e.g., element 232 in FIG. 2), the mixer 330 and the LO 332 as the transmit mixer/upconverter (e.g., element 234 in FIG. 2) and the transmitter LO signal generator (e.g., element 236 in FIG. 2), respectively, and the RF amplifier 340 as the power amplifier (e.g., element 238 in FIG. 2). The RF amplifier 340 sends the RF signal to the antenna interface circuit through switch S8. Arrowed and dashed lines 410 show the transmit path of the signal.

Figure 4B:
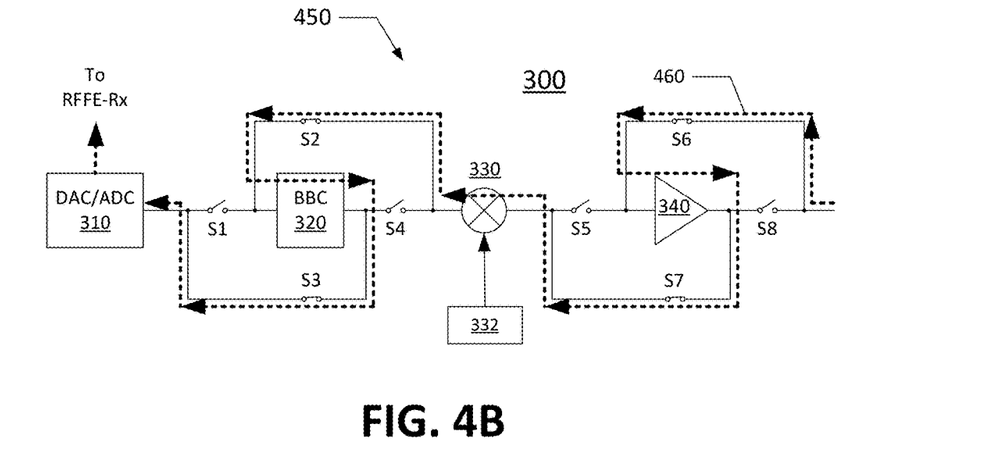
FIG. 4B shows a configuration in which switches S2, S3, S6, and S7 are closed while switches S1, S4, S5, and S8 are open to configure the transceiver into a receive mode.

FIG. 4B shows a configuration 450 in which switches S2, S3, S6, and S7 are closed while switches S1, S4, S5, and S8 are open to configure the transceiver 300 into a receive mode. Thus, in FIG. 4B, the switches in the transceiver 300 are configured to receive the RF signal from the antenna interface circuit through switch S6 and use the RF amplifier 340 as the low noise amplifier (e.g., element 258 in FIG. 2), the mixer 330 and the LO 332 as the receive mixer/downconverter (e.g., element 254 in FIG. 2) and the receiver LO signal generator (e.g., element 256 in FIG. 2), respectively, the baseband circuitry 320 as the receive baseband circuitry (e.g., element 252 in FIG. 2), and the converter 310 as the ADC (e.g., element 290 in FIG. 2). Arrowed and dashed lines 460 show the receive path of the signal.

Figure 5:
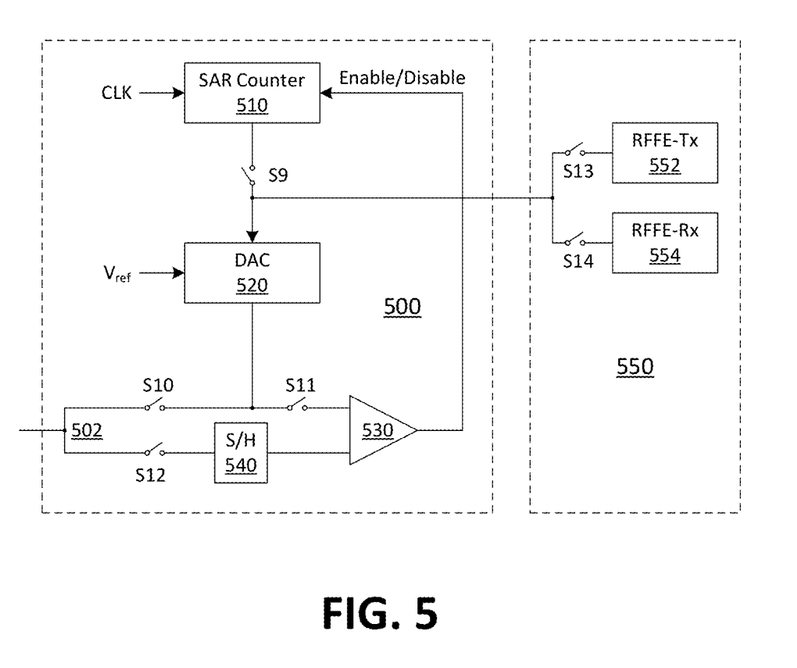
FIG. 5 is a detailed functional block diagram of a converter in accordance with one embodiment of the present disclosure.
Figure 6A:
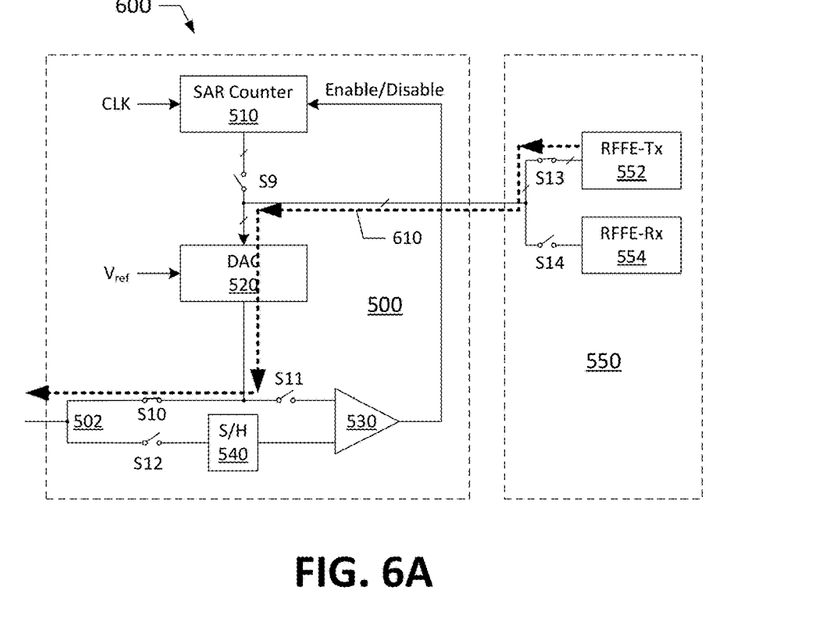
FIG. 6A shows a configuration in which switches S10 and S13 are closed while switches S9, S11, S12, and S14 are open to configure the converter as a DAC used in the transmit mode.
Figure 6B:
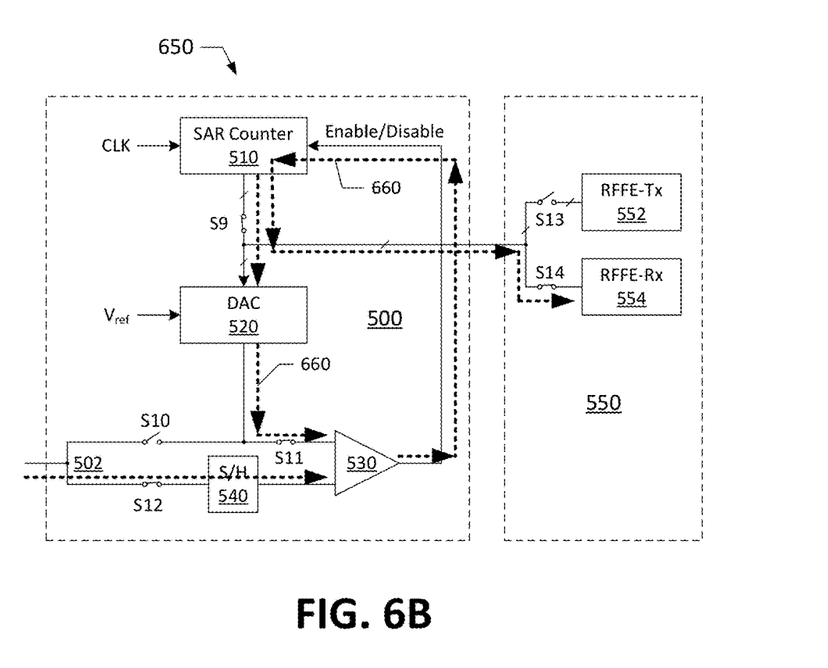
FIG. 6B shows a configuration in which switches S9, S11, S12, and S14 are closed while switches S10 and S13 are open to configure the converter as an ADC used in the receive mode.

In one embodiment, shown in FIG. 5, FIG. 6A, and FIG. 6B, the converter (e.g., element 310 in FIG. 3) is reconfigurable into a DAC in the transmit mode, while the converter is reconfigurable into an ADC in the receive mode. In another embodiment, shown in FIG. 7, FIG. 8A, FIG. 8B, FIG. 8C, and FIG. 8D, the RF amplifier (e.g., element 340 in FIG. 3) is reconfigurable into an LNA in the receive mode, while the RF amplifier is reconfigurable into a PA in the transmit mode. In the illustrated embodiment of FIG. 7, the PA is configured into one of three different power levels.

FIG. 5 is a detailed functional block diagram of a converter 500 in accordance with one embodiment of the present disclosure. The converter 500 shown in FIG. 5 is one implementation of a DAC/ADC 310 of FIG. 3. Thus, in FIG. 5, the converter 500 is configured to be used as a DAC in the transmit mode, while the converter 500 is configured to be used as an ADC in the receive mode. FIG. 5 also shows a digital baseband module 550 which includes a RFFE-Tx 552 and a RFFE-Rx 554.

In the illustrated embodiment of FIG. 5, the converter 500 is provided with a SAR ADC configuration and a plurality of switches S9 to S12, while the digital baseband module 550 is provided with switches S13, S14. The SAR ADC configuration of the converter 500 includes SAR logic comprising at least a SAR counter 510, a DAC 520, a comparator 530, and a sample and hold circuit 540. The converter 500 communicates with the RFFE-Tx 552 and the RFFE-Rx 554 of the digital baseband module 550 through switches S13 and S14. Thus, by appropriately configuring the switches S9 to S14, the converter 500 can be configured to be used as a DAC or ADC.

FIG. 6A, for example, shows a configuration 600 in which switches S10 and S13 are closed while switches S9, S11, S12, and S14 are open to configure the converter 500 as a DAC used in the transmit mode. Thus, in FIG. 6A, switch S13 couples the digital transmit baseband output of the RFFE-Tx module 552 to the input of the DAC 520, which converts the digital transmit baseband signal to the analog baseband signal. Switch S10 couples the analog baseband signal at the output of the DAC 520 to node 502 of the converter 500. Arrowed and dashed lines 610 show the path of the signal that is being converted from the digital baseband to the analog baseband.

FIG. 6B, for example, shows a configuration 650 in which switches S9, S11, S12, and S14 are closed while switches S10 and S13 are open to configure the converter 500 as an ADC used in the receive mode. Thus, in FIG. 6B, switch S12 couples the analog baseband signal input to the converter 500 at node 502 to a first input of the comparator 530 through the sample-and-hold circuit (S/H) 540. Further, switch S11 couples the output of the DAC 520 to a second input of the comparator 530. The comparator 530 compares the two inputs received through switches S11 and S12 (through the S/H 540) and outputs a signal to the SAR counter 510 to enable or disable the count in the SAR counter 510. The output signal of the SAR counter 510 is coupled to the input of the RFFE-Rx module 554 by switches S9 and S14. Switch S9 also couples the output signal of the SAR counter 510 to the DAC 520 to adjust the analog value. Arrowed and dashed lines 660 show the path of the signal that is being converted from the analog baseband to the digital baseband.

Figure 7:
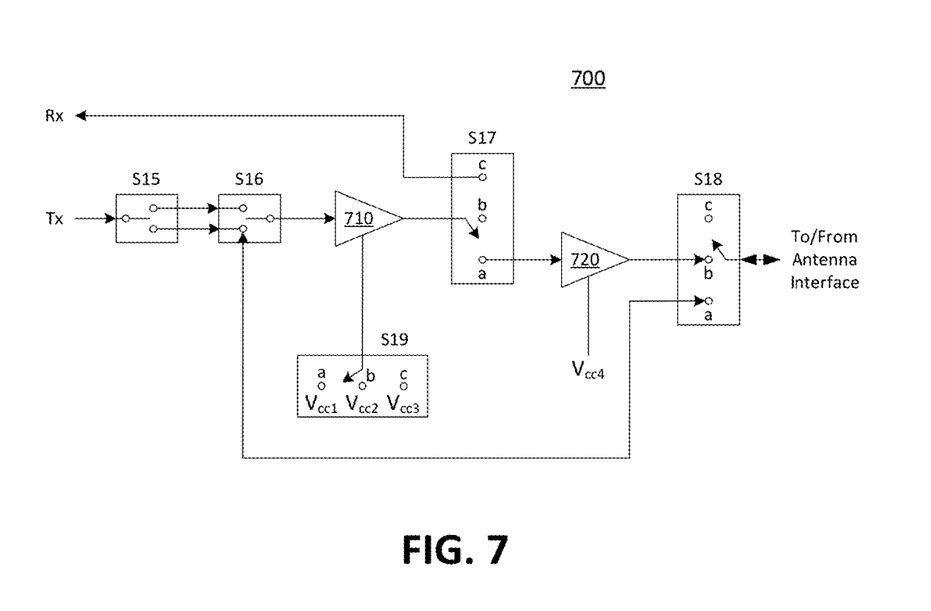
FIG. 7 is a detailed functional block diagram of an RF amplifier in accordance with one embodiment of the present disclosure.

FIG. 7 is a detailed functional block diagram of an RF amplifier 700 in accordance with one embodiment of the present disclosure. The RF amplifier shown in FIG. 7 is one implementation of an RF amplifier 340 of FIG. 3. In FIG. 7, the RF amplifier 700 is configured to be used as a PA in the transmit mode, while the RF amplifier 700 is configured to be used as an LNA in the receive mode. Further, in the transmit mode, the RF amplifier 700 can be configured as a low-power PA, mid-power PA, or high-power PA. Thus, by appropriately configuring the switches S15 to S19, the RF amplifier 700 can be configured to be used as an LNA or three different power levels of the PA. Although FIG. 7 shows three power levels, switches can be configured to be used for any number of power levels for the PA.

Figure 8A:
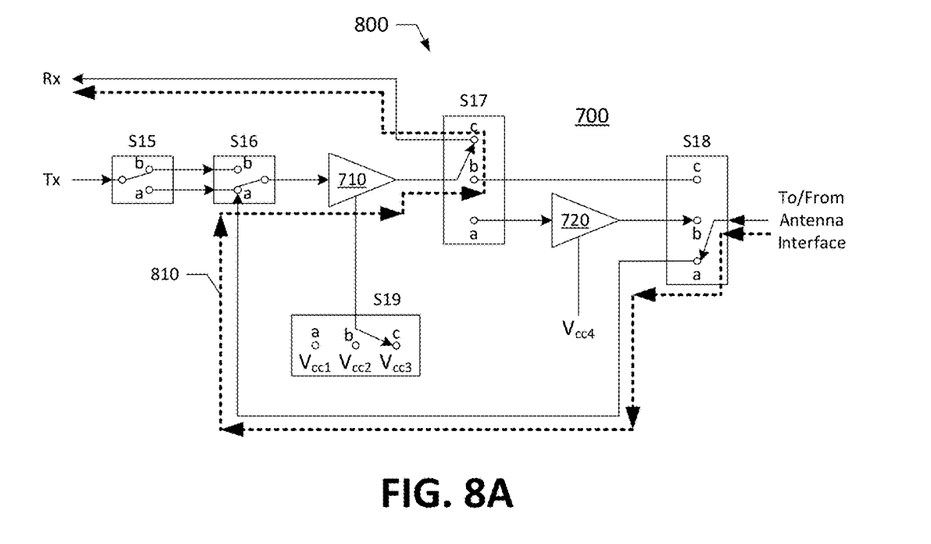
FIG. 8A shows a configuration in which switch S18 is connected to 'a' terminal, switch S16 is connected to 'a' terminal, and switch S17 is connected to 'c' terminal to configure the RF amplifier with one amplifier as the LNA used in the receive mode.

FIG. 8A, for example, shows a configuration 800 in which switch S18 is connected to 'a' terminal, switch S16 is connected to 'a' terminal, and switch S17 is connected to 'c' terminal to configure the RF amplifier 700 with an amplifier 710 as the LNA used in the receive mode. Arrowed and dashed lines 810 show the path of the RF signal that is received from the antenna interface circuit and sent to the mixer/downconverter (e.g., 330 in FIG. 3) configured in the receive mode. Switch S15 is connected to 'b' terminal to prevent the Tx signal from being leaked into the transceiver 700 and mixing with the received RF signal. Switch S19 is connected to 'c' terminal to supply the amplifier 710 with a supply voltage, $V_{cc3}$.

Figure 8B:
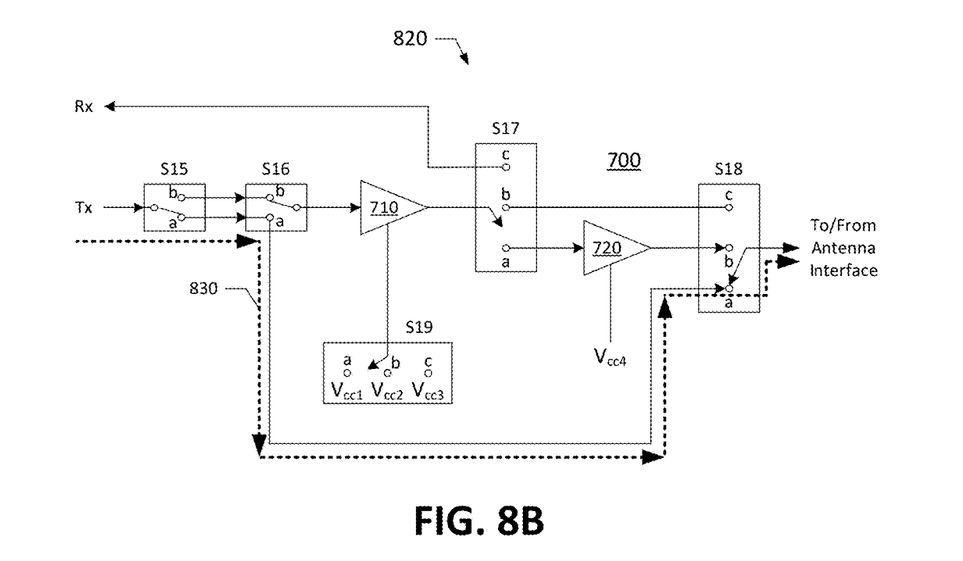
FIG. 8B shows a configuration in which switch S15 is connected to 'a' terminal, switch S16 is connected to 'b' terminal, and switch S18 is connected to 'a' terminal to configure the RF amplifier as the low-power PA used in the transmit mode.

FIG. 8B shows a configuration 820 in which switch S15 is connected to 'a' terminal, switch S16 is connected to 'b' terminal, and switch S18 is connected to 'a' terminal to configure the RF amplifier 700 as the low-power PA used in the transmit mode. Arrowed and dashed lines 830 show the path of the RF signal that is received from the mixer/upconverter (e.g., 330 in FIG. 3) configured in the transmit mode and sent to the antenna interface circuit. Thus, the configuration 820 of the RF amplifier 700 as the low power PA does not use an amplifier.

Figure 8C:
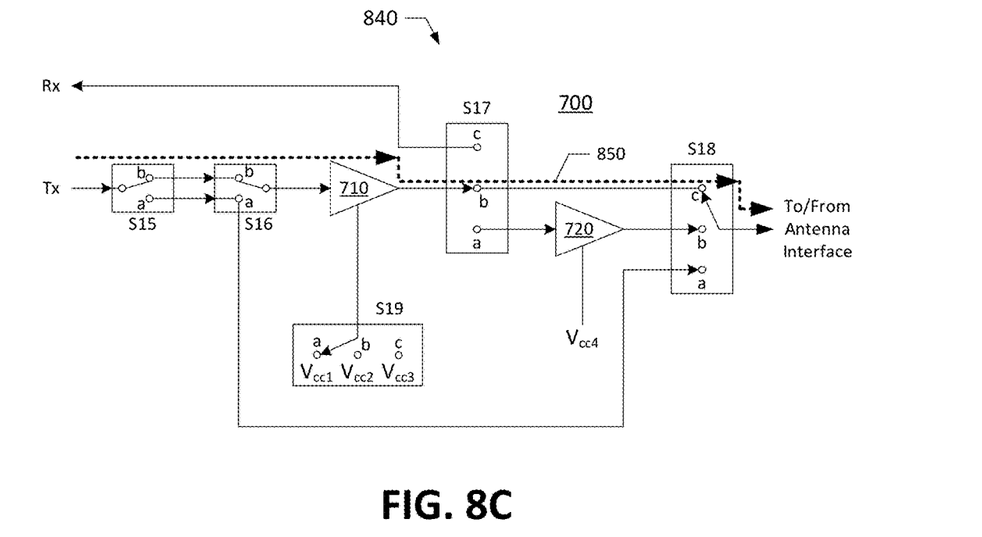
FIG. 8C shows a configuration in which switch S15 is connected to 'b' terminal, switch S16 is connected to 'b' terminal, switch S17 is connected to 'b' terminal, and switch S18 is connected to 'c' terminal to configure the RF amplifier with one amplifier as the mid-power PA used in the transmit mode.

FIG. 8C shows a configuration 840 in which switch S15 is connected to 'b' terminal, switch S16 is connected to 'b' terminal, switch S17 is connected to 'b' terminal, and switch S18 is connected to 'c' terminal to configure the RF amplifier 700 with an amplifier 710 as the mid-power PA used in the transmit mode. Arrowed and dashed lines 850 show the path of the RF signal that is received from the mixer/upconverter (e.g., 330 in FIG. 3) configured in the transmit mode and sent to the antenna interface circuit. Switch S19 is connected to 'a' terminal to supply the amplifier 710 with a supply voltage, $V_{cc1}$.

Figure 8D:
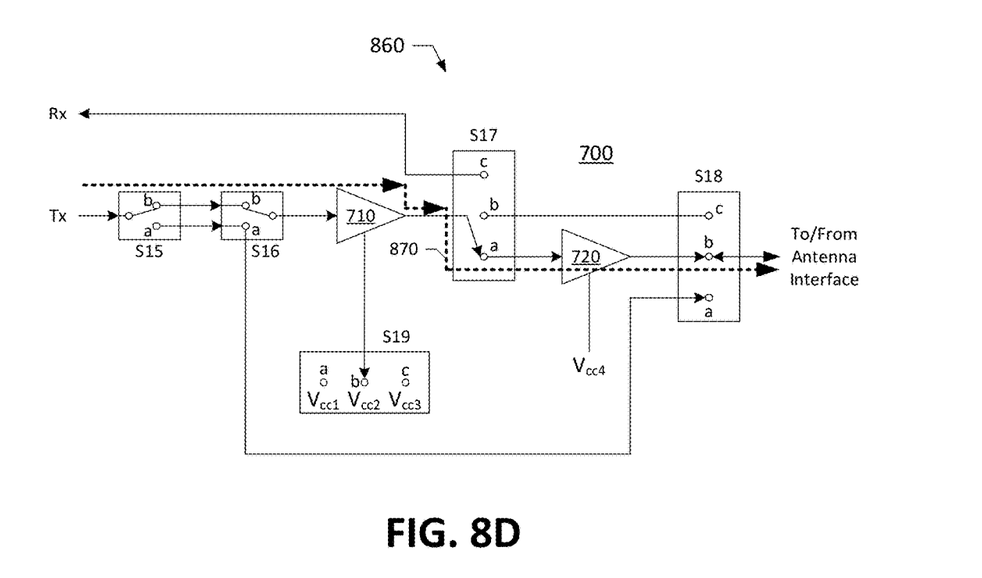
FIG. 8D shows a configuration in which switch S15 is connected to 'b' terminal, switch S16 is connected to 'b' terminal, switch S17 is connected to 'a' terminal, and switch S18 is connected to 'b' terminal to configure the RF amplifier with multi-stage amplifiers as the high-power PA used in the transmit mode.

FIG. 8D shows a configuration 860 in which switch S15 is connected to 'b' terminal, switch S16 is connected to 'b' terminal, switch S17 is connected to 'a' terminal, and switch S18 is connected to 'b' terminal to configure the RF amplifier 700 with multi-stage amplifiers 710 and 720 as the high-power PA used in the transmit mode. Arrowed and dashed lines 870 show the path of the RF signal that is received from the mixer/upconverter (e.g., 330 in FIG. 3) configured in the transmit mode and sent to the antenna interface circuit. Switch S19 is connected to 'b' terminal to supply the amplifier 710 with a supply voltage, $V_{cc2}$. The amplifier 720 is supplied with a second supply voltage, $V_{cc4}$.

It should be noted that the switches shown in FIGS. 3, 4A-4B, 5, 6A-6B, 7, and 8A-8D are controlled by the data processor/controller 210 shown in FIG. 2 or a separate controller. The controller controls the opening or closing of the switches to configure or reconfigure the transceiver (e.g., element 300 in FIG. 3 or element 500 in FIG. 5) or other units (e.g., unit 310 or unit 340 in FIG. 3) within the transceiver.

Figure 9:
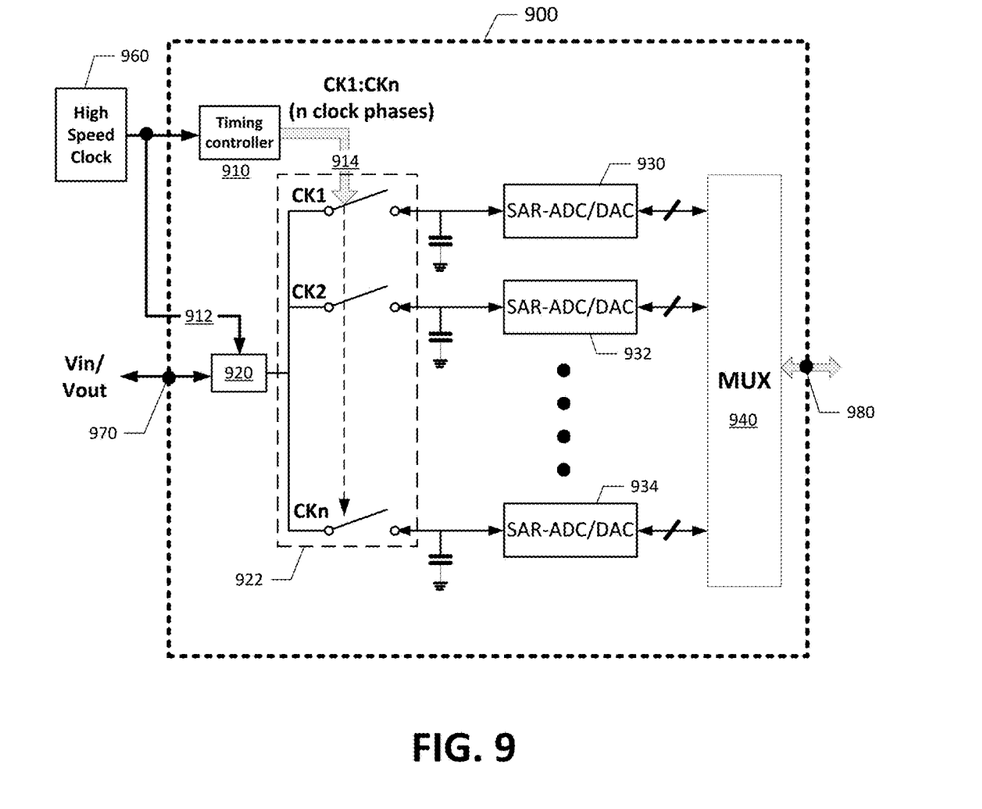
FIG. 9 is a functional block diagram of a time-interlaced ADC in accordance with one embodiment of the present disclosure.

FIG. 9 is a functional block diagram of a time-interlaced ADC 900 in accordance with one embodiment of the present disclosure. Time interleaving may increase the speed of analog-to-digital converters (ADCs), albeit with a possible power and area penalty. However, time interleaving offers additional benefits even if absolute speed is not of primary interest. The extent to which interleaving improves the conversion rate may depend on the relative speeds of the sampler and the quantizer in each channel.

In the illustrated embodiment of FIG. 9, the time-interlaced ADC 900 receives an analog signal at terminals 970 and outputs a digital signal at terminals 980. The time-interlaced ADC 900 includes a timing controller 910, first and second stage sampling switches 920, 922, a plurality of SAR ADCs 930, 932, 934, and a multiplexer 940. The high speed clock 910 controls the first stage sampling switch 920 using a single clock line 912. A clock signal from the high speed clock 960 is also sent to the timing controller 910. The timing controller 910 controls the second stage sampling switches 922 using multiple clock lines (n) 914 to control the plurality of second stage sampling switches 922, wherein each switch controls the time interlacing of each of the plurality of SAR ADCs 930, 932, 934. Thus, the number (n) of the second stage sampling switches matches the number of SAR ADCs 930, 932, 934. Further, each of the plurality of SAR ADCs 930, 932, 934 may receive a reference voltage from a reference voltage generator (not shown). The outputs of the plurality of SAR ADCs 930, 932, 934 are output to the multiplexer 940, which selects the outputs of one of the SAR ADCs 930, 932, 934.

In the illustrated embodiment of FIG. 9, the time-interlaced ADC 900 is configured with SAR-ADCs that are interlaced in time to generate a high speed ADC. In one embodiment, each of the SAR-ADCs 930, 932, 934 can be configured as the converter 500 shown in FIG. 5. Thus, when each of the SAR-ADCs 930, 932, 934 is operating as an ADC as shown in FIG. 6B, the signals flow as described above from the analog terminals 970 to digital terminals 980. However, when each of the SAR ADCs 930, 932, 934 is operating as a DAC as shown in FIG. 6A, the signals flow in reverse of the above-description from the digital terminals 980 to the analog terminals 970.

Figure 10:
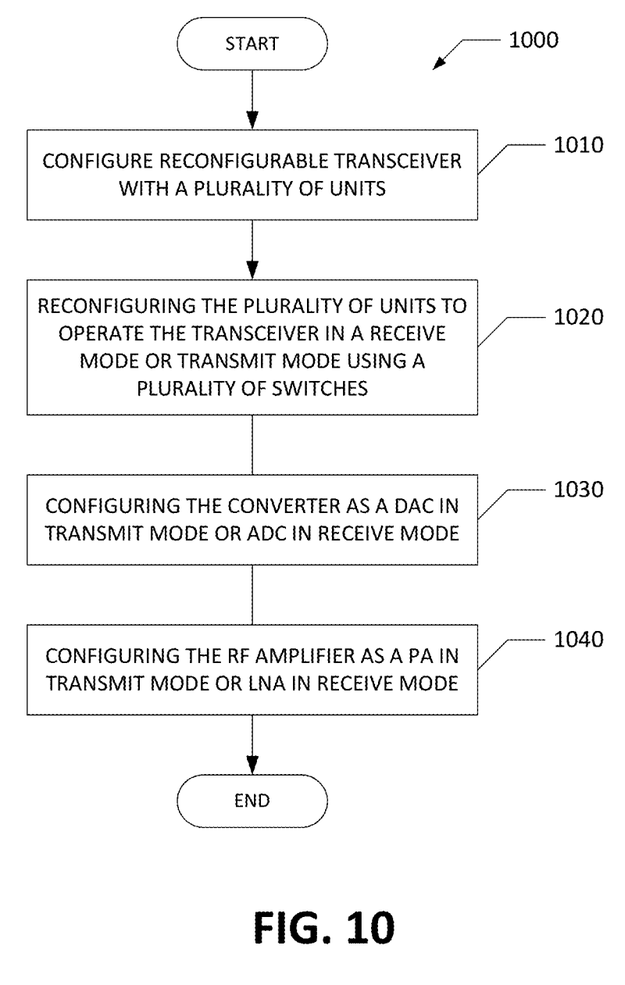
FIG. 10 is a functional flow diagram illustrating a method for reconfiguring a reconfigurable transceiver in accordance with one embodiment of the present disclosure.

FIG. 10 is a functional flow diagram illustrating a method 1000 for reconfiguring a reconfigurable transceiver using a controller in accordance with one embodiment of the present disclosure. In the illustrated embodiment of FIG. 10, the method 1000 includes configuring the reconfigurable transceiver with a plurality of units, at block 1010, and reconfiguring the plurality of units, at block 1020, to operate the reconfigurable transceiver in a receive mode or transmit mode using a plurality of switches. The plurality of units includes at least a converter and an RF amplifier. In FIG. 10, reconfiguring the plurality of units includes configuring the converter as a DAC in the transmit mode or ADC in the receive mode, at block 1030. Reconfiguring the plurality of units also includes configuring the RF amplifier as an LNA in the receive mode or PA in the transmit mode, at block 1040.

Although several embodiments of the disclosure are described above, many variations of the disclosure are possible. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a module, block, or step is for ease of description. Specific functions or steps can be moved from one module or block without departing from the disclosure.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

The invention claimed is:

1. A transceiver comprising:
   a reconfigurable circuit including a plurality of units comprising at least a converter, the converter comprising:
   a digital-to-analog converter (DAC);
   successive approximation register (SAR) logic configured to selectively couple to the DAC;
   a plurality of switches configured to reconfigure the plurality of units of the reconfigurable circuit to operate the transceiver in a receive mode or transmit mode;
   the plurality of units further comprising a baseband circuitry configured to:
   operate as a transmitter baseband circuitry including at least one of transmitter baseband amplifiers and filters in the receive mode; and
   operate as a receiver baseband circuitry including at least one of receiver baseband amplifiers and filters in the transmit mode.

2. The transceiver of claim 1, wherein the converter is operable to be configured as an analog-to-digital converter (ADC) in the receive mode via connection of the SAR logic, using one or more of the plurality of switches, to the DAC.

3. The transceiver of claim 2, wherein the converter further comprises:
   a comparator; and
   a sample and hold circuit coupled to a first input of the comparator.

4. The transceiver of claim 3, wherein the converter is operable to be further configured as the ADC via:
   connection of a first input of the sample and hold circuit, using one or more of the plurality of switches, to a transceiver branch;
   connection of a second input of the comparator, using one or more of the plurality of switches, to the DAC; and
   disconnection of an output of the DAC, using one or more of the plurality of switches, from the transceiver branch.

5. The transceiver of claim 1, wherein the converter is operable to be configured as the DAC in the transmit mode via disconnection of the SAR logic, using one or more of the plurality of switches, from the DAC.

6. The transceiver of claim 5, wherein the converter is operable to be further configured as the DAC via:
   disconnection of an input of a sample and hold circuit coupled to a first input of a comparator, using one or more of the plurality of switches, from a transceiver branch;
   disconnection of a second input of the comparator, using one or more of the plurality of switches, from the DAC; and
   connection of an output of the DAC using one or more of the plurality of switches, to the transceiver branch.

7. The transceiver of claim 1, wherein the plurality of units further comprises a mixer and a radio frequency (RF) amplifier.

8. The transceiver of claim 7, wherein the RF amplifier is configured as a low noise amplifier (LNA) in the receive mode or a power amplifier (PA) in the transmit mode.

9. The transceiver of claim 7, wherein the RF amplifier is configured as a low-power amplifier, mid-power amplifier, or a high-power amplifier in the transmit mode.

10. The transceiver of claim 9, wherein the mid-power amplifier is configured with one amplifier.

11. The transceiver of claim 9, wherein the high-power amplifier is configured with a plurality of amplifiers in a multi-stage configuration.

12. The transceiver of claim 7, wherein the mixer is configured as a baseband-to-RF converter of a transmitter.

13. The transceiver of claim 7, wherein the mixer is configured as an RF-to-baseband converter of a receiver.

14. The transceiver of claim 1, wherein the converter comprises a SAR analog to digital converter (ADC), the SAR ADC configured as one of a plurality of ADCs operating in a time-interlaced mode.

15. The transceiver of claim 14, wherein the SAR ADC is configured as an ADC for operating in the receive mode.

16. The transceiver of claim 14, wherein the SAR ADC is configured as a DAC for operating in the transmit mode.

17. The transceiver of claim 1, wherein the plurality of units of the reconfigurable circuit is configured to operate the transceiver in the receive mode or transmit mode using a half-duplex mode of operation.

18. A method for reconfiguring a reconfigurable transceiver, the method comprising:
   configuring the reconfigurable transceiver with a plurality of units comprising at least a converter, the converter comprising a successive approximation register (SAR) and a digital-to-analog converter (DAC), in a receive mode by at least coupling a SAR counter to the DAC;

configuring the plurality of units to operate the reconfigurable transceiver in a transmit mode by at least decoupling the SAR counter from the DAC, wherein configuring the plurality of units comprises configuring the converter as a DAC in the transmit mode or an analog-to-digital converter (ADC) in the receive mode, and wherein configuring the converter as the DAC in the transmit mode further comprises:

disconnecting an input of a sample and hold circuit coupled to a first input of a comparator, using one or more of a plurality of switches, from a transceiver branch;

disconnecting a second input of the comparator, using one or more of the plurality of switches, from the DAC; and connecting an output of the DAC using one or more of the plurality of switches, to the transceiver branch.

19. The method of claim 18, wherein configuring the converter as the ADC in the receive mode further comprises:

connecting an input of a sample and hold circuit coupled to a first input of a comparator, using one or more of a plurality of switches, to a transceiver branch;

connecting a second input of the comparator, using one or more of the plurality of switches, to the DAC; and disconnecting an output of the DAC, using one or more of the plurality of switches, from the transceiver branch.

20. The method of claim 18, wherein the plurality of units includes a radio frequency (RF) amplifier, and wherein configuring the plurality of units comprises configuring the RF amplifier as a low noise amplifier (LNA) in the receive mode or power amplifier (PA) in the transmit mode.

21. A transceiver comprising:

a reconfigurable circuit including a plurality of units comprising at least a converter, the converter comprising:

a digital-to-analog converter (DAC);

successive approximation register (SAR) logic configured to selectively couple to the DAC;

a plurality of switches configured to reconfigure the plurality of units of the reconfigurable circuit to operate the transceiver in a receive mode or transmit mode;

the plurality of units further comprising a mixer and a radio frequency (RF) amplifier, wherein the RF amplifier is configured as a low-power amplifier, mid-power amplifier, or a high-power amplifier in the transmit mode, wherein the mid-power amplifier is configured with one amplifier, and wherein the high-power amplifier is configured with a plurality of amplifiers in a multi-stage configuration.

* * * * *